United States Patent
Maiocchi et al.

(10) Patent No.: US 6,310,912 B1
(45) Date of Patent: Oct. 30, 2001

(54) SYSTEM FOR INCREASING THE DEFINITION IN CONVERTING A DIGITAL DATUM IN A PWM SIGNAL FOR DRIVING A FULL-BRIDGE OUTPUT STAGE

(75) Inventors: Giuseppe Maiocchi, Villa Guardia; Ezio Galbiati, Agnadello, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/112,999

(22) Filed: Jul. 10, 1998

(30) Foreign Application Priority Data

Jul. 17, 1997 (EP) .................................... 97830361

(51) Int. Cl.[7] .................................... H03K 9/08
(52) U.S. Cl. ...................... 375/238; 318/268.2
(58) Field of Search .................. 375/238; 700/13; 318/568.2, 16

(56) References Cited

U.S. PATENT DOCUMENTS

| | | | |
|---|---|---|---|
| 4,138,632 | * 2/1979 | Pauwels et al. | 318/599 |
| 4,590,457 | 5/1986 | Amir | 340/347 |
| 4,894,598 | * 1/1990 | Daggett | 318/568.16 |
| 5,103,462 | 4/1992 | Elle et al. | 375/22 |
| 5,488,487 | * 1/1996 | Ojima et al. | 358/456 |
| 5,933,344 | * 8/1999 | Mitsuishi et al. | 364/142 |

FOREIGN PATENT DOCUMENTS

0760552 A1   8/1995   (EP) .

OTHER PUBLICATIONS

Miguel F. escalante G, Pulse Width Modulated Inverter with Current Control, IEEE 1995, pp. 74–79.*

J. Brett and R. M. Nelms, Speed Control of a Brushless DC Motor Using Pulse Density Modulation and MCT's, IEEE 1994, pp. 356–362.*

* cited by examiner

*Primary Examiner*—Stephen Chin
*Assistant Examiner*—Tony Al-Beshrawi
(74) *Attorney, Agent, or Firm*—Theodore E. Galanthay; Allen, Dyer, Doppelt, Milbrath & Gilchrist, P.A.

(57) ABSTRACT

The definition of conversion of a digital value in a PWM signal using an N-bit up/down counter is improved by increasing the dimension of the input data to N+2 bits. This is done using the two Lsb's of the N+2 input data for selecting one among three intermediate levels between two consecutive values of an N-bit dynamic, according to a predefined table of combinations. The converter may still use an N-bit comparator. The system is particularly useful in driving a multi-phase brushless DC motor with each phase-winding singularly driven through a full-bridge output stage.

9 Claims, 8 Drawing Sheets

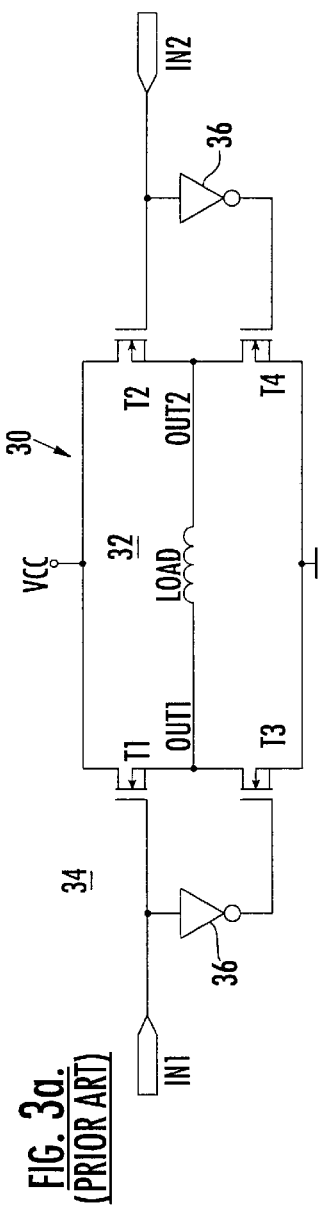
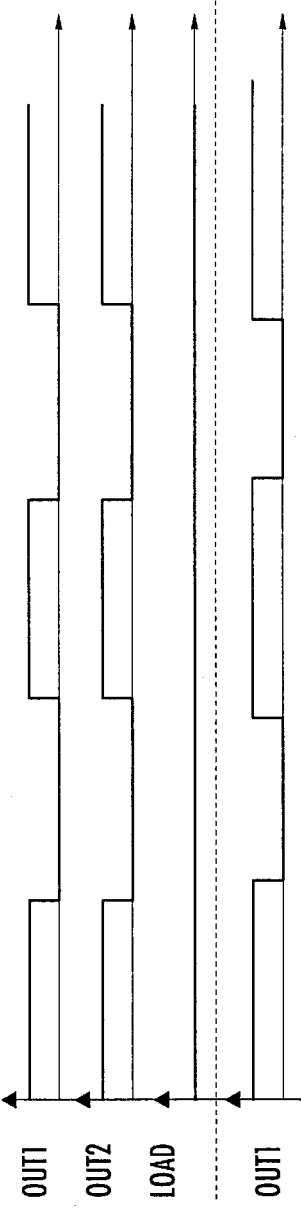
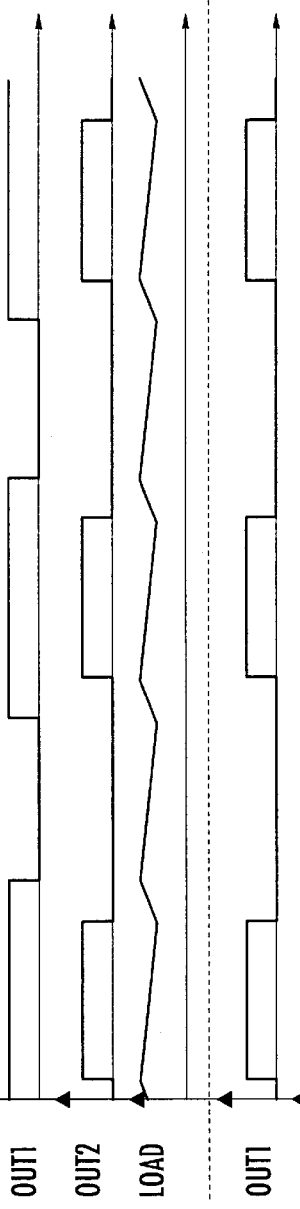
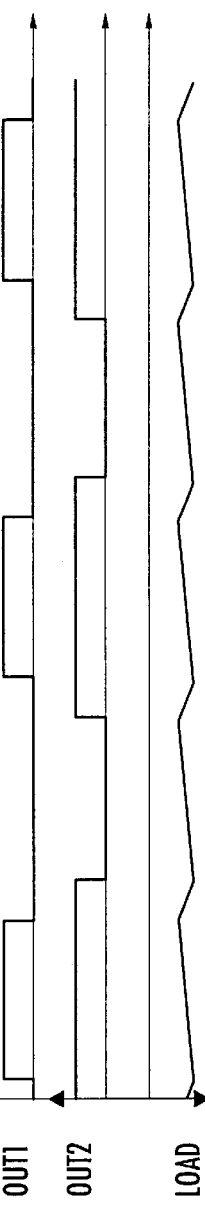
FIG. 3a. (PRIOR ART)
FIG. 3b. (PRIOR ART)
FIG. 3c. (PRIOR ART)
FIG. 3d. (PRIOR ART)

SYSTEM FOR INCREASING THE DEFINITION IN CONVERTING A DIGITAL DATUM IN A PWM SIGNAL FOR DRIVING A FULL-BRIDGE OUTPUT STAGE

FIELD OF APPLICATION OF THE INVENTION

The present invention relates to techniques for driving a generic resistor-inductor (R-L) actuator through an output power stage having a so-called bridge configuration, and, more particularly, to a technique for driving an output bridge stage in a pulse-width modulation (PWM) mode, thus partitioning the voltage delivered to the actuator and thereby controlling the current flowing through it.

BACKGROUND OF THE INVENTION

The control signal of a PWM driving system may, according to recently developed techniques, be generated by a circuit that transforms a predefined N-bit digital value permanently stored in a nonvolatile memory, that can be scanned at a variable clock speed, into a digital signal. The digital signal will have an amplitude compatible with the input requirements of the output power stage, and the duty-cycle is proportional to the N-bit digital value read from the memory.

A conversion system of this nature where N=8 is described in the European patent application No. 96830295.0, filed on May 22, 1996, and assigned to the assignee of the present invention. A conversion system as those mentioned above and shown in FIG. 1 is based on comparing the input BYTE (N=8) containing the value to be converted with the state of an 8-bit counter functioning in a continuous up/down mode.

A sample signal is input to the input register 10 acting as the SL latch with appropriate circuit input signal from newsamp. The input register output is then input to the comparator circuit 14 which receives another signal from up/down counter circuit 16. This, in turn, receives the clock signal and outputs a signal to the comparator circuit 14. Another output from the comparator circuit is input into logic circuit 18 together with output EN from up/down counter circuit 16 into the clock input for the FF2 circuit 12. This acts as a set circuit with an output PWMOUT. The up/down counter circuit receives an end of counter output into the FF1 circuit 20, which also has an output back to the counter circuit. An initialized circuit 22 inputs a reset and set signal to respective FF1 and FF2 circuits.

The above referred conversion circuit is depicted in FIG. 2. By referring to FIGS. 1 and 2, the sample (N=8 BYTE) to be converted is synchronously loaded in the SL register to prevent sample updating during its conversion. The comparator COMP generates a clock impulse for the toggle bistable circuit FF2 each time the counter CNT state equals the value of the sample to be converted. This generates a signal PWMOUT whose duty-cycle varies proportionally with the input sample value and symmetrically with respect to the maximum counting value.

However, as it may be observed, the unitary increment (highlighted in an exaggerated manner in FIG. 2) of the input sample value to be converted results in a double and symmetric decrement of the output duty-cycle. For example, going from a sample value 188 to a sample value 189 results in a duty-cycle decrement as depicted by the dashed line of FIG. 2.

In driving an output bridge stage by controlling the current in a Phase Shift Modulation mode, according to the method disclosed in the European patent application No. 95830371.1, filed Aug. 3, 1995, and assigned to the assignee of the present invention, two digital values must be converted, one for each half-bridge, having a symmetric value about $2^N/2$. In a driving system of this kind, where to a unit increment of the digital signal forced in a half-bridge corresponds a unit decrement of the digital signal that is simultaneously forced in the other half-bridge to maintain symmetry. A double duty-cycle differential increment is produced if compared to the case of a half-bridge output stage.

SUMMARY OF THE INVENTION

An object of the present invention is a circuit that improves the definition of the above mentioned conversion process by increasing from N to N+2 bits the dimension of the input datum, thereby improving the control of the current in the actuator without incrementing the size (number of bits) of the digital comparator. The system of the present invention avoids the prior art augmented duty-cycle increments for unitary variations of the value of input samples in driving a full-bridge.

The invention is effective in "monophase" systems employing a single full-bridge output stage, as well as in multi-phase systems using a plurality of full-bridge output stages. The invention may be used, for example, in certain driving systems for multi-phase brushless electric motors for permitting a dynamic control of the driving mode.

BRIEF DESCRIPTION OF THE DRAWINGS

FIGS. 3a, 3b, 3c and 3d show respectively the output bridge stage and the drive signals originating from the NBITS/PWM converter as in the prior art.

DETAILED DESCRIPTION OF THE PREFERRED EMBODIMENTS

As shown in FIGS. 3a, 3b, 3c and 3d, relative to a PWM driving system 30 of a generic R-L actuator 32 through a bridge output stage 34 according to a Phase Shift Modulation mode as described in the above mentioned European patent application No. 95830371.1 filed Aug. 3, 1995, assigned to the assignee of the present invention, the two signals IN1 and IN2 are obtained by converting into two PWM signals an original digital datum DATAIN which is considered stored in N+2 bits. Logic circuits 36 are operable with the PWM driving system 30 as known to those skilled in the art. To analyze the behavior of such a known system, the N Msb's of DATAIN will be referred to as VAL, whereas the complement of VAL, with respect to $2^N/2$, will be referred to as *VAL+1.

In the present context, reference is made to systems where N=8 even though theoretically N may be of any integer value. The condition of null current through the load is obtained when the two input signals IN1 and IN2 are perfectly in phase with each other and with a duty-cycle equal to 50%. This corresponds to input the BYTE/PWM block with two identical values of VAL and *VAL+1 both equal to 128 in decimal value ($2^N/2$ in the case of a generic N value).

Figures 1, 2:
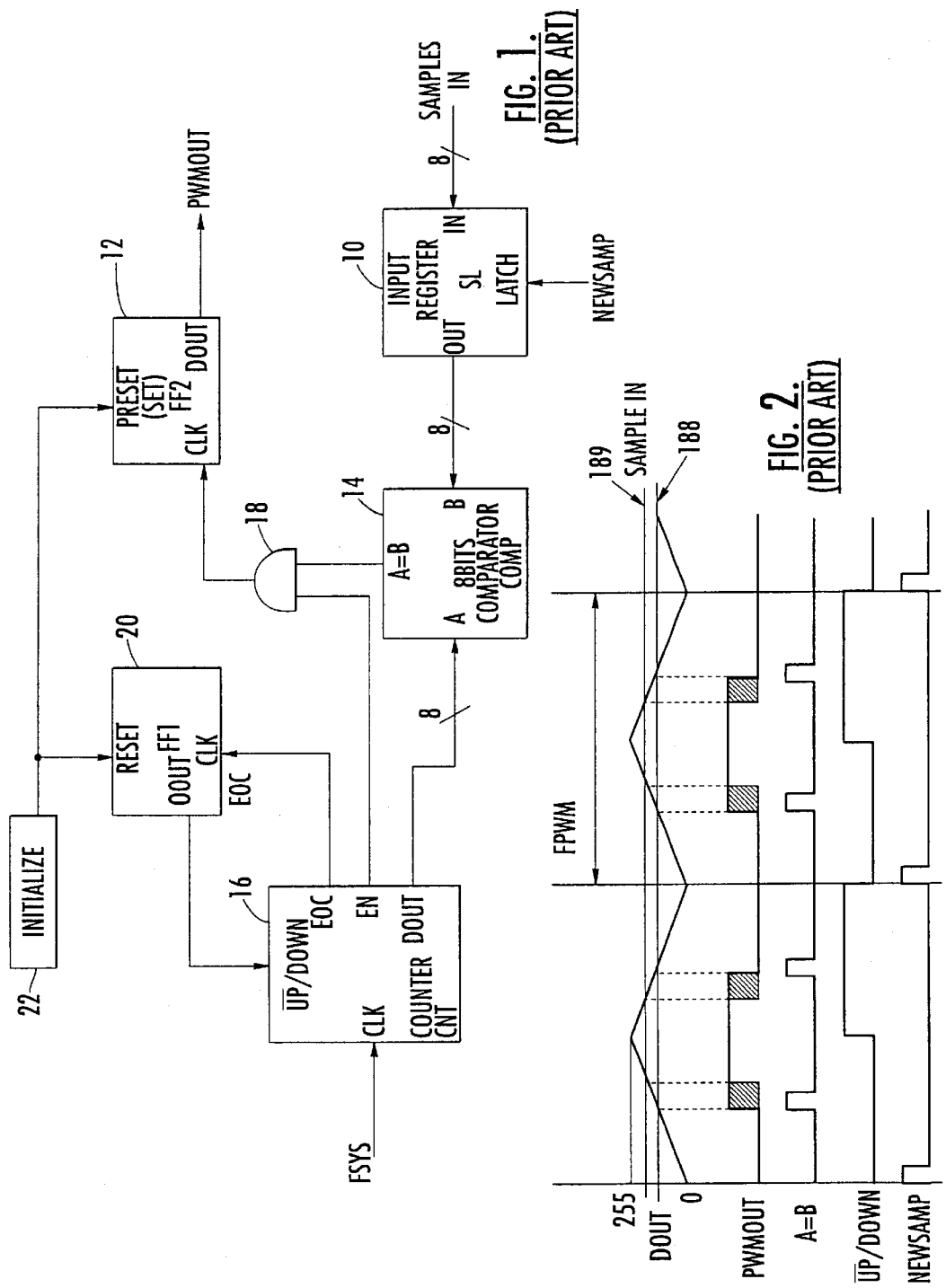
FIG. 1 shows a BYTE/PWM converter (N=8) as described in the above mentioned patent application as in the prior art.
FIG. 2 show the signals generated by the prior art circuit of FIG. 1.
Figure 4:
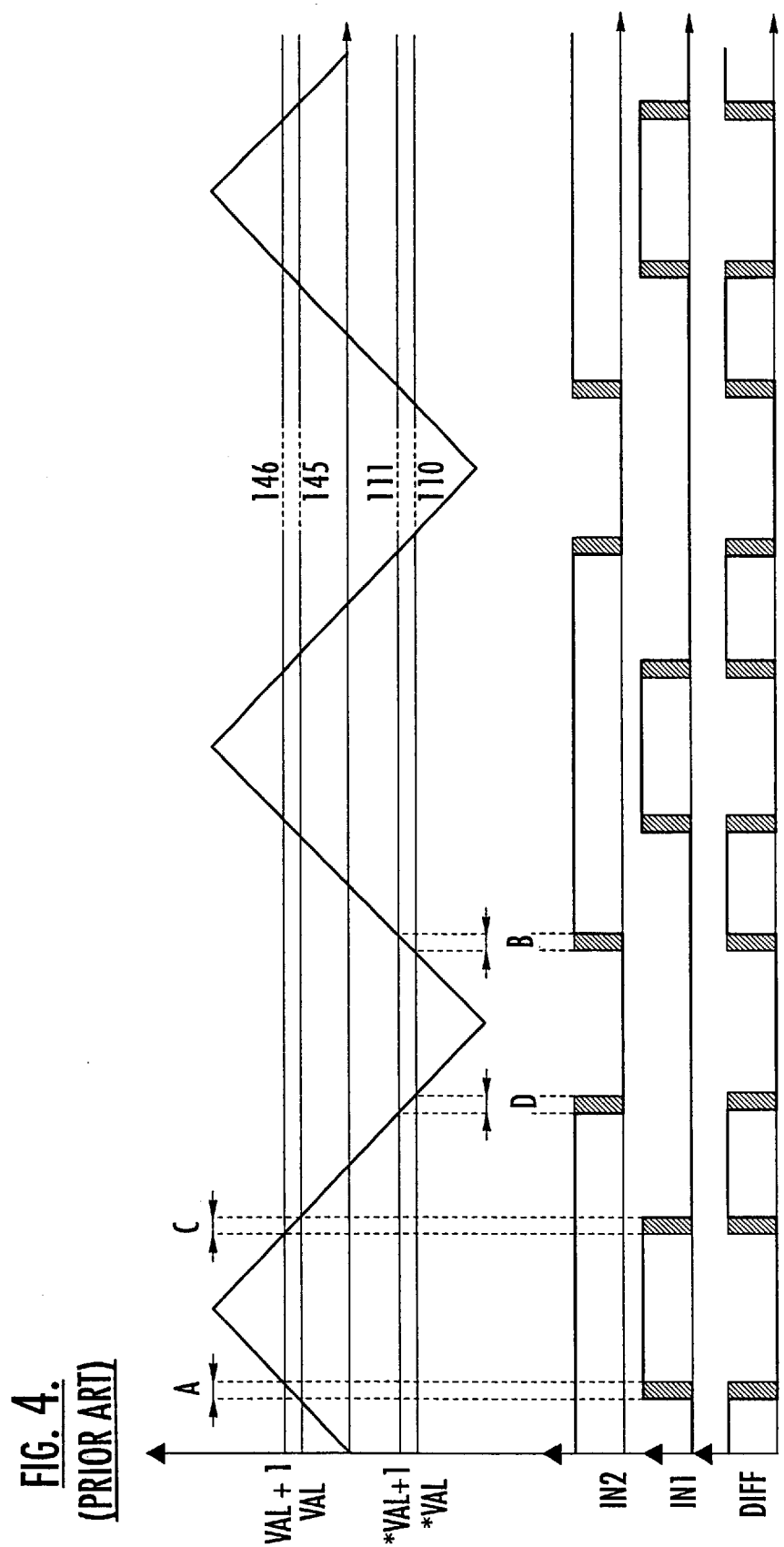
FIG. 4 shows the duty-cycle variation that is obtained with a unit variation of the digital value to be converted in a PWM signal as in the prior art

To a unitary increment of VAL corresponds a unitary decrement of *VAL+1 to maintain symmetry about the value corresponding to a null current through the load ($2^N/2$ for the case of a generic N value). As noticed in FIG. 4, in a whole period of the up/down counter there exist four instants of comparison among the values VAL, *VAL+1 and the state or content of the counter. In the example of FIG. 4, the value VAL is incremented from 145 to 146 and, correspondingly, the value of *VAL+1, symmetric about the value 128, is decremented from 111 to 110. This corresponds to a duty-cycle decrement by an amount A+C for the signal N1, and an increment by an amount B+D for the IN2 signal, respectively.

The differential duty-cycle DIFF is therefore incremented by A+B+C+D pursuant to a unitary increment/decrement of VAL and *VAL+1. Thus, the system permits having a definition of 1/255 ($1/(2^N-1)$) in the case of a generic N value) for a differential duty-cycle ranging from 0 to 100%.

For the case of the known system, the four comparisons take place without any further processing. Contrarily, according to the present invention, adequate actions are forced depending on the condition of the 2 Lsb's of the DATAIN signal to be converted. Advantageously, the system of the present invention permits obtaining a greater definition without increasing the number of bits of the up/down counter (comparator).

Figure 5:
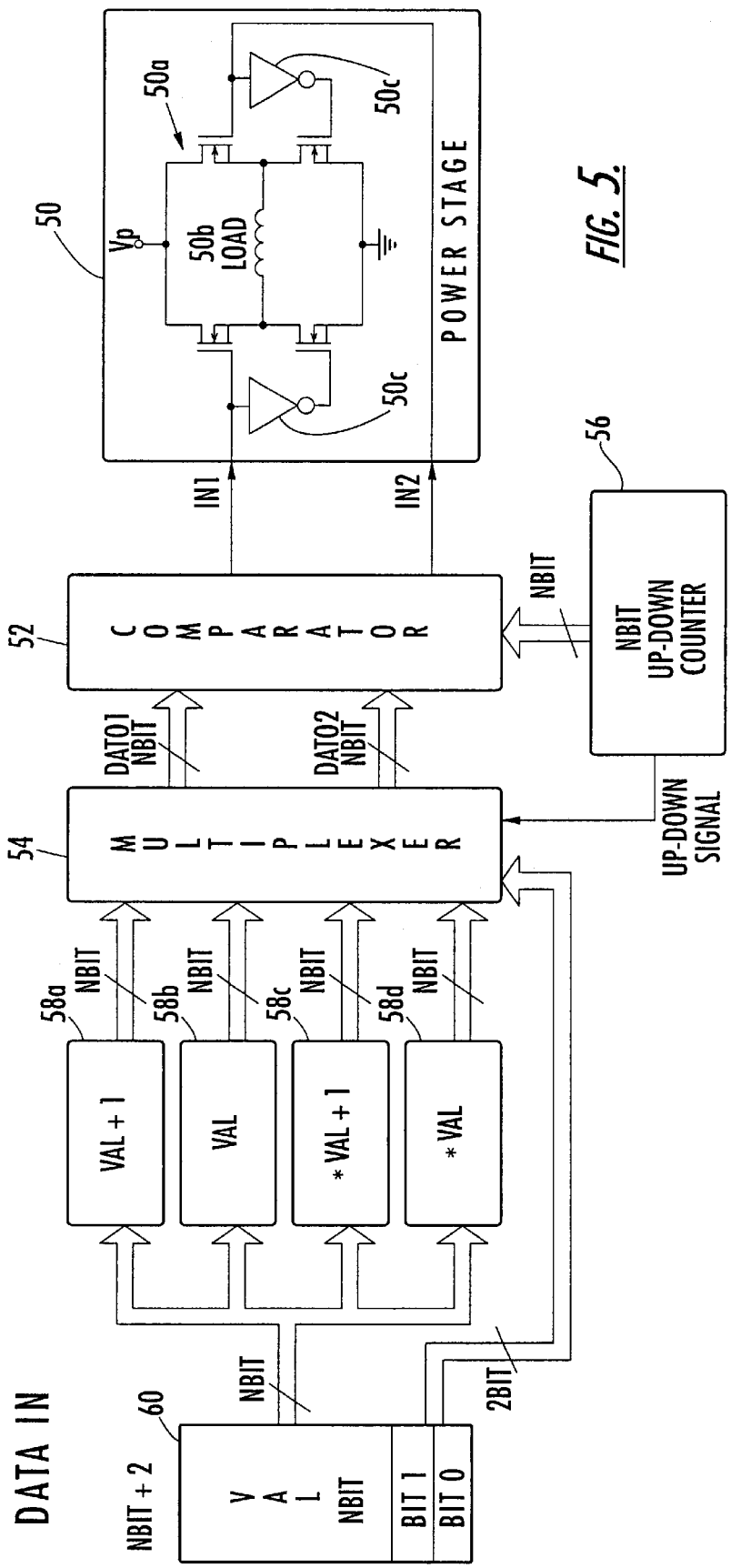
FIG. 5 shows the block diagram of the N+2 BIT DATA/PWM converter of the present invention.

More precisely, if N is the number of bits of the up/down counter, the system herein disclosed allows for the conversion of an input datum (original datum) mapped on N+2 bits. FIG. 5 shows a block diagram of the system of the invention. The DATAIN value to be converted is mapped on N+2 bits in the memory. Among these, the N Msb's are indicated with VAL. From the value VAL, by means of a simple logic processing, the complementary value *VAL is obtained and the two digital values are loaded into two registers of N-bits each. Two additional N-bit registers contain the same values incremented by 1.

The two Lsb's of the input value, together with the up/down signal of the counter, are used by the multiplexing block to select the datum to be compared. This selection occurs according to the following table.

TABLE 1

| UP-DOWN | BIT 1 | BIT 2 | DATUM 1 | DATUM 2 |
|---------|-------|-------|---------|---------|
| 0 | 0 | 0 | VAL | * VAL+1 |
| 0 | 0 | 1 | VAL | * VAL+1 |
| 0 | 1 | 0 | VAL | * VAL+1 |
| 0 | 1 | 1 | VAL+1 | * VAL+1 |
| 1 | 0 | 0 | VAL | * VAL+1 |
| 1 | 0 | 1 | VAL+1 | * VAL+1 |

TABLE 1-continued

| UP-DOWN | BIT 1 | BIT 2 | DATUM 1 | DATUM 2 |
|---------|-------|-------|---------|---------|
| 1 | 1 | 0 | VAL+1 | * VAL |
| 1 | 1 | 1 | VAL+1 | * VAL |

The power stage circuit 50 includes a PWM driving system circuit 50a and is operative through the R-L actuator 50b and logic circuits 50c, which connect to comparator 52 that is operative with N bit up-down counter 56 and multiplexer 54. Val circuits 58a–58d receive data from val circuit 60, and also inputs to multiplexer, which receives data from val circuit 60.

As shown in FIG. 5 and in TABLE 1, the two least significative bits of the input datum are used by a digital circuit to identify three intermediate levels between two consecutive values representable by an N-bit dynamic. In the case of N=8, VAL equal to 145 and, consequently, *VAL+1 equal to 111, the following situation exists:

| 8 Msb's | bit1 | bit0 | effective value | Resulting Dcxxx |
|---------|------|------|-----------------|-----------------|
| 145 | 0 | 0 | 145 | DC145 |
| 145 | 0 | 1 | 145.25 | DC145+A |
| 145 | 1 | 0 | 145.5 | DC145+A+B |
| 145 | 1 | 1 | 145.75 | DC145+A+B+C |

Thus, the two supplementary Lsb's are used by a dedicated digital circuit to decide "how much" the base duty-cycle (identified by DC145 and corresponding to the two Isb equal to zero) should be incremented or decremented.

Naturally the following relationship applies:

DC145+A+B+C+D=DC146

Hence, the system functions in a dynamic manner generating a different duty-cycle depending on the value of the two Lsb's of the data to be converted and of the counting direction of the up/down counter. This results in a definition which is four times higher than that in the case of the known system taken as a comparative example, while using a comparator of the same number of bits. Thereby the comparator generates the two signals IN1 and IN2 that drive the output power stage.

From Table 1 and FIGS. 6a, 6b, 6c and 6d, the way the intermediate levels between two consecutive values VAL are obtained as may be observed. For example, by assuming VAL=145, then:

VAL=145 VAL+1=146 *VAL=110 *VAL+1=111

In the case of converting 145 (FIG. 6), the fractionary term is null because BIT0=0 and BIT1=0. From Table 1 and from FIG. 6a it may be noticed that DATO1 and DATO2 are forced respectively to VAL and to *VAL+1, during the timer "UP COUNTING" as well as during "DOWN COUNTING". The result of this conversion is observable in FIG. 6a.

Figure 6A:
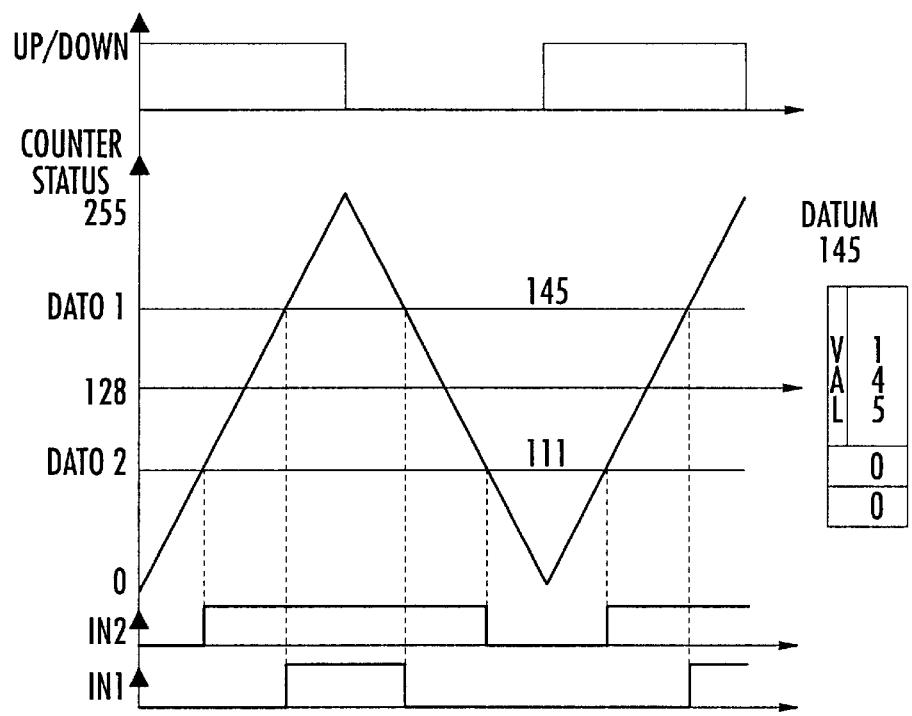
FIGS. 6a, 6b, 6c and 6d show the way the conversion of an N+2 bit input datum takes place for different configurations of the 2 Lsb's of the original data.
Figure 6B:
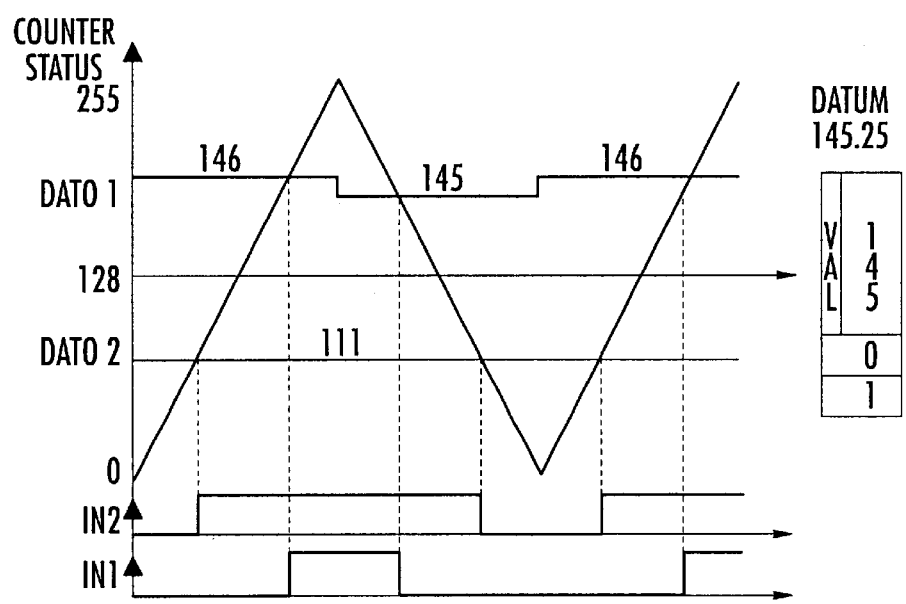

If 145.25 (FIG. 6b) must be converted, then BIT0=1 and BIT1=0. In this case there exists a modulation of DATO 1 resulting in the conversion of VAL+1 when the timer is counting "UP" and the conversion of VAL when the timer is counting "DOWN". The result of this conversion is illustrated in FIG. 6b.

Figure 6C:
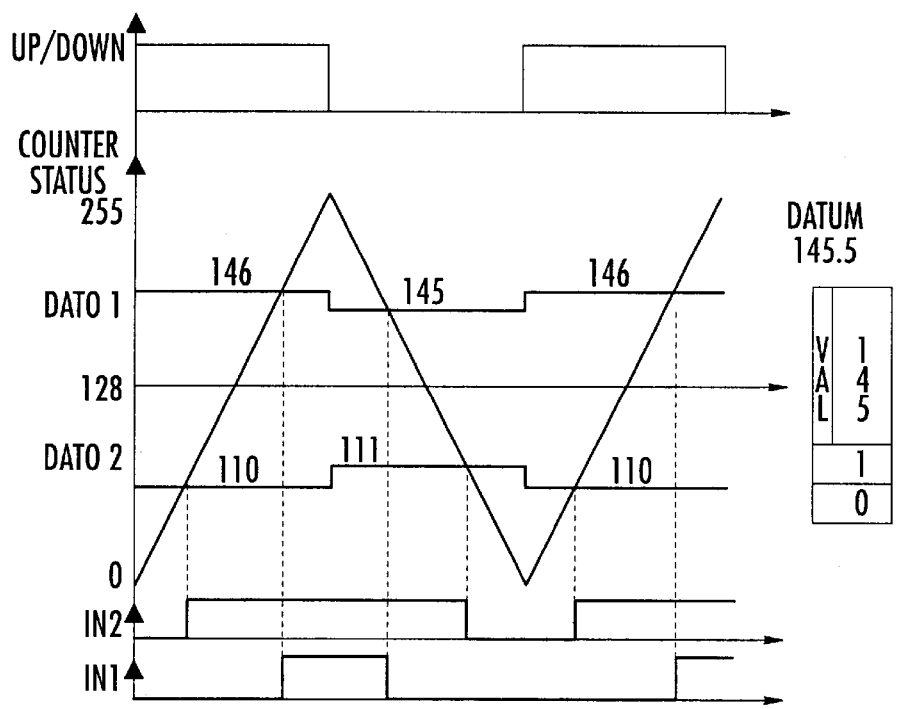

In case of converting 145.50 (FIG. 6c), BIT0=0 and BIT1=1. In this case there is a modulation of both input data namely of DATO1 and DATO2, which implies the conversion of VAL+1 and *VAL when the timer is counting "UP" and the conversion of VAL and *VAL+1 when the timer is counting "DOWN". The result of this conversion is depicted in FIG. 6c.

Figure 6D:
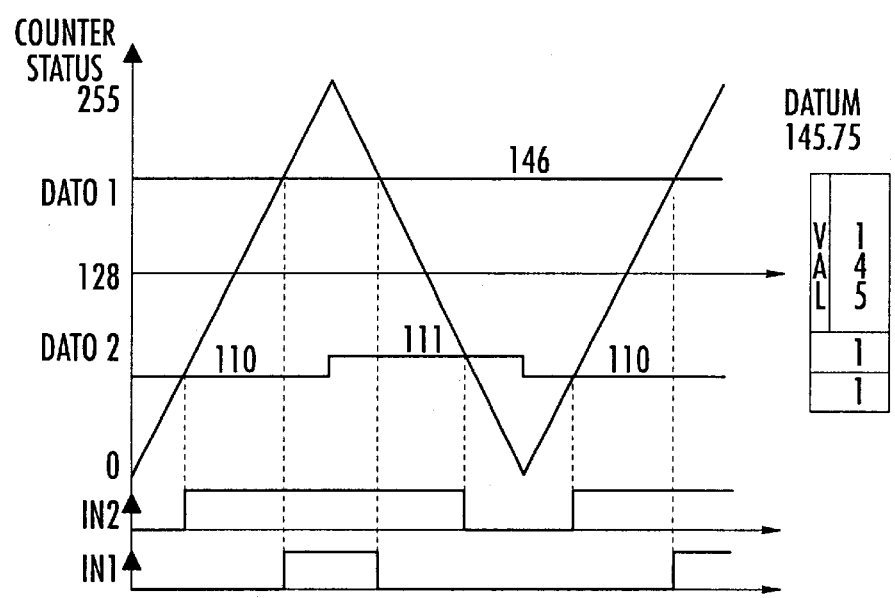

In case of converting 145.75 (FIG. 6d), BIT0=1 and BIT1=1. In this case there is a modulation of DATO2 resulting in the conversion of *VAL when the timer is counting "UP" and the conversion of *VAL+1 when the timer is counting "DOWN". By contrast, DATO1 is always equal to VAL+1. The result of the conversion is depicted in FIG. 6d.

An important application of the invention is for a driving system of a multi-phase, typically three-phase, brushless motor employing distinct full-bridge output stages for driving the phase windings of the motor. Although the independent driving of each winding through a dedicated full-bridge stage requires access to both ends of the windings (that are not connected in a star configuration as customary), the ability of driving independently each phase winding permits reaching the highest speed as in the case of a unipolar driving mode of the multiphase motor. Moreover, for a three-phase motor, it may be demonstrated that the maximum speed that is attainable is higher than the speed attainable with a star configuration by a factor of $\sqrt{3}$ in a bipolar driving mode, and by a factor of 2 in a tripolar driving mode.

Figure 7:
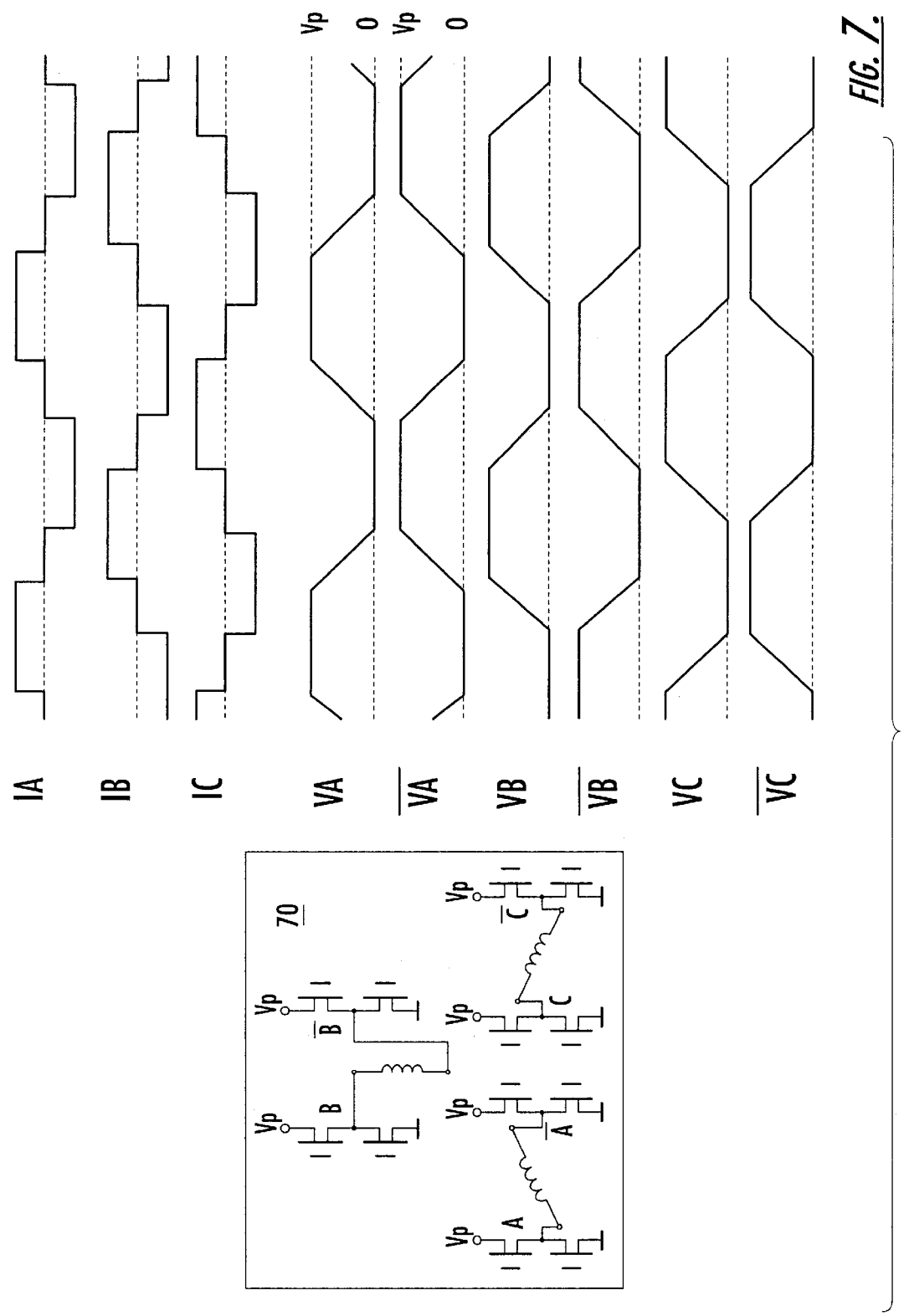
FIG. 7 shows the relative electrical scheme and waveforms of the currents and voltages in the case of a bipolar driving mode of a three-phase motor.
Figure 8:
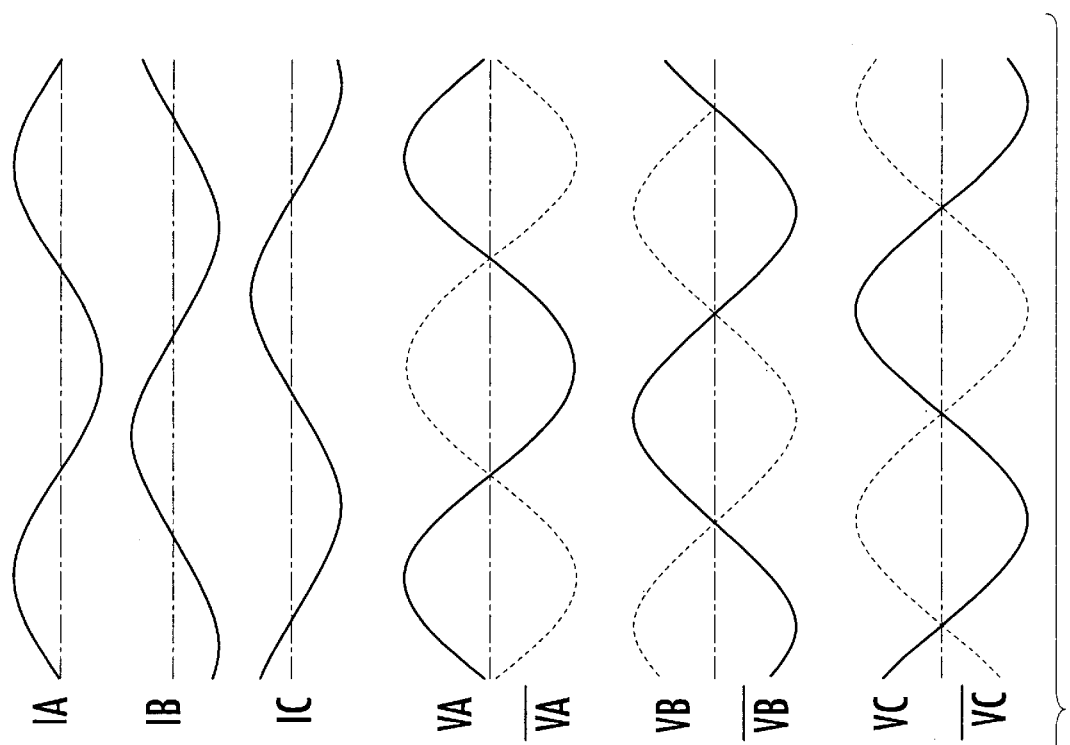
FIG. 8 show the electrical driving scheme and waveforms of the currents and voltages in the case of a tripolar driving mode, using sinusoidal current profiles.

FIGS. 7 and 8 show various bipolar transistor circuits 70 operative for respective full-bridge driving and electrical driving with the respective waveforms of the currents and voltages as generated.

FIG. 7 shows the electric scheme of a full-bridge driving of the single windings and the waveforms of the currents and of the voltages in case of a bipolar driving mode. FIG. 8 shows the electrical driving scheme and the waveforms of the currents and of the voltages in case of a tripolar driving mode, using sinusoidal current profiles.

In an application such as the one illustrated in FIGS. 7 and 8, the invention provides a significant improvement that adds advantages in terms of maximum speed attainable, provided by the independent driving of each motor winding through a full-bridge output stage controlled in a PWM mode.

That which is claimed is:

1. A method for increasing a definition of conversion of a PWM signal using an up/down N-bit counter, the method comprising the steps of:
   increasing a dimension of an N-bit digital value to an N+2 bit digital value, the N+2 bit digital value having two least significant bits and N most significant bits;
   using the two least significative bits to select one among three intermediate levels between two consecutive values representable by an N-bit digital value according to a predefined table of combinations;
   using the N most significative bits to store four values in respective ones of four registers, the four stored values comprising the N-bit digital value, a complement of the N-bit digital value, the N-bit digital value incremented by 1, and a complement of the N-bit input digital value incremented by 1; and
   using the two least significative bits and an up/down output signal of the up/down N-bit counter to select a pair of the four stored values to be compared during each up-counting phase and down-counting phase of the up/down N-bit counter as a function of the predefined table of combinations.

2. A method for driving an inductive load through a power output stage, the method comprising the steps of:
   increasing a definition of conversion of a PWM signal using an up/down N-bit counter by
   increasing a dimension of an N-bit digital value to an N+2 bit digital value, the N+2 bit digital value having two least significant bits and N most significant bits,
   using the two least significative bits to select one among three intermediate levels between two consecutive values representable by an N-bit digital value according to a predefined table of combinations,
   using the N most significative bits to store four values in respective ones of four registers, the four stored values comprising the N-bit digital value, a complement of the N-bit digital value, the N-bit digital value incremented by 1, and a complement of the N-bit input digital value incremented by 1, and
   using the two least significative bits and an up/down output signal of the up/down N-bit counter to select a pair of the four stored values to be compared during each up-counting phase and down-counting phase of the up/down N-bit counter as a function of the predefined table of combinations to produce an increased definition PWM signal; and driving the inductive load with the power stage using the increased definition PWM signal.

3. A system for driving an inductive load comprising:
   a power output stage connected to the inductive load; and
   conversion means for converting an N-bit digital value into a PWM signal for the power output stage, said conversion means comprising
   an N-bit comparator connected to said power output stage,
   an up/down N-bit counter connected to said N-bit comparator,
   a register having a capacity of N+2 bits for storing an N+2 bit digital value based upon an N-bit digital value,
   four additional registers for storing four values comprising the N-bit digital value, a complement of the N-bit digital value, the N-bit digital value incremented by 1, and a complement of the N-bit digital value incremented by 1, respectively, and
   a multiplexer for selecting a pair of the four stored values in said four additional registers to be compared in said N-bit comparator when said up/down N-bit counter is counting up and is counting down based upon a combination of values of the two least significative bits of the N+2 bit digital value and by an up/down signal of said up/down N-bit counter.

4. A system according to claim 3 further comprising a bistable circuit generating a PWM signal as a function of an output of said N-bit comparator.

5. A circuit for increasing a definition of a conversion of a digital value in a PWM signal using an up/down N-bit counter, the circuit comprising:
   means for increasing a dimension of an N-bit input digital value to N+2 bit digital value, the N+2 bit digital value having N most significant bits and two least significant bits;
   means for using the two least significative bits to select one among three intermediate levels between two consecutive values representable by the N-bit input digital value according to a predefined table of combinations;
   means for using the N most significative bits to store four values comprising the N-bit digital value, a complement of the N-bit digital value, the N-bit digital value incremented by 1, and a complement of the N-bit digital value incremented by 1;

an up/down counter; and means for using the two least significant bits and an up/down output signal of the up/down N-bit counter to select a pair of the four stored values to be compared during each up-counting phase and down-counting phase of the up/down N-bit counter as a function of the predefined table of combinations.

6. A circuit according to claim 5, further comprising four registers for storing respective ones of the four values.

7. A driving circuit for a brushless DC multi-phase motor of a type comprising a plurality of phase windings, said driving circuit comprising:

a full-bridge power output stage for each phase winding of the motor; and conversion means for converting an N-bit digital value into a PWM signal for the power output stage, said conversion means comprising an N-bit comparator connected to said power output stage, an up/down N-bit counter connected to said N-bit comparator, a register having a capacity of N+2 bits for storing an N+2 bit digital value based upon an N-bit digital value, four additional registers for storing four values comprising the N-bit digital value, a complement of the N-bit digital value, the N-bit digital value incremented by 1, and a complement of the N-bit digital value incremented by 1, respectively, and a multiplexer for selecting a pair of the four stored values in said four additional registers to be compared in said N-bit comparator when said up/down N-bit counter is counting up and is counting down based upon a combination of values of the two least significative bits of the N+2 bit digital value and by an up/down signal of said up/down N-bit counter.

8. A driving circuit according to claim 7, further comprising a bistable circuit generating a PWM signal as a function of the output of said N-bit comparator.

9. A driving circuit for a brushless DC multi-phase motor of a type comprising a plurality of phase windings, said driving circuit comprising:

a full-bridge power output stage for each phase winding of the motor; and conversion means for converting an N-bit digital value into a PWM signal for the power output stage, said conversion means comprising means for increasing a dimension of an N-bit input digital value to N+2 bit digital value, the N+2 bit digital value having N most significant bits and two least significant bits, means for using the two least significative bits to select one among three intermediate levels between two consecutive values representable by the N-bit input digital value according to a predefined table of combinations, means for using the N most significant bits to store four values comprising the N-bit digital value, a complement of the N-bit digital value, the N-bit digital value incremented by 1, and a complement of the N-bit digital value incremented by 1, an up/down counter, and means for using the two least significant bits and an up/down output signal of the up/down N-bit counter to select a pair of the four stored values to be compared during each up-counting phase and down-counting phase of the up/down N-bit counter as a function of the predefined table of combinations.

* * * * *